US010797709B2

(12) United States Patent
Rogers et al.

(10) Patent No.: US 10,797,709 B2
(45) Date of Patent: *Oct. 6, 2020

(54) METHOD AND CIRCUITS FOR FINE-CONTROLLED PHASE/FREQUENCY OFFSETS IN PHASE-LOCKED LOOPS

(71) Applicant: Analog Bits Inc., Sunnyvale, CA (US)

(72) Inventors: Alan C. Rogers, Palo Alto, CA (US); Raghunand Bhagwan, Sunnyvale, CA (US)

(73) Assignee: Analog Bits Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/353,161

(22) Filed: Mar. 14, 2019

(65) Prior Publication Data

US 2019/0207610 A1    Jul. 4, 2019

Related U.S. Application Data

(63) Continuation of application No. 15/846,353, filed on Dec. 19, 2017, now Pat. No. 10,236,895.

(51) Int. Cl.
*H03L 7/087* (2006.01)
*H03L 7/18* (2006.01)
*H03L 7/089* (2006.01)
*H03L 7/081* (2006.01)
*H03L 7/197* (2006.01)
*H03L 7/099* (2006.01)

(52) U.S. Cl.
CPC .............. *H03L 7/087* (2013.01); *H03L 7/081* (2013.01); *H03L 7/0891* (2013.01); *H03L 7/18* (2013.01); *H03L 7/197* (2013.01); *H03L 7/099* (2013.01)

(58) Field of Classification Search
CPC . H03L 7/06; H03L 7/08; H03L 7/0802; H03L 7/087

See application file for complete search history.

(56) References Cited

U.S. PATENT DOCUMENTS

| 4,827,225 A | 5/1989 | Lee |
| 5,341,405 A | 8/1994 | Mallard, Jr. |
| 5,646,563 A | 7/1997 | Kuo |

(Continued)

OTHER PUBLICATIONS

PCT International Search Report in International Application No. PCT/US2018/065253, dated Feb. 15, 2019, 6 pages.

*Primary Examiner* — Hai L Nguyen
(74) *Attorney, Agent, or Firm* — Fish & Richardson P.C.

(57) ABSTRACT

Implementations provide a phase locked loop (PLL) device that includes: a phase and frequency detector (PFD) and charge pump (CP) portion; a low pass filter; a voltage controlled oscillator (VCO) driven by the low pass filter to generate a VCO clock signal, multiple divider configured to receive the VCO clock signal and frequency divide the VCO clock signal in stages to generate a series statically divided VCO clock signals and a dynamically divided VCO clock signal; a feedback portion including a first component configured to receive the dynamically divided VCO clock signal and generate indicator signals; and a second component configured to multiplex from the indicator signals to generate the feedback clock signal set for the PFD and CP portion; and a master phase/frequency control engine configured to assert a division control over at least one divider and a multiplex control over the multiplex network.

12 Claims, 9 Drawing Sheets

(56) References Cited

U.S. PATENT DOCUMENTS

| | | | |
|---|---|---|---|
| 5,825,640 | A | 10/1998 | Quigley et al. |
| 6,052,015 | A | 4/2000 | Desbonnets |
| 6,064,250 | A | 5/2000 | Proebsting |
| 6,118,346 | A | 9/2000 | Olgaard |
| 6,124,741 | A | 9/2000 | Arcus |
| 6,278,332 | B1 | 8/2001 | Nelson et al. |
| 6,316,977 | B1 | 11/2001 | Sargeant |
| 6,326,852 | B1 | 12/2001 | Wakayama |
| 6,661,683 | B2 | 12/2003 | Botker et al. |
| 6,885,251 | B2 | 4/2005 | Delmot et al. |
| 7,078,977 | B2 * | 7/2006 | Maneatis ............... H03L 7/0893 327/156 |
| 7,183,822 | B1 | 2/2007 | Bolton et al. |
| 7,492,196 | B2 | 2/2009 | Lever |
| 7,888,980 | B2 | 2/2011 | Li et al. |
| 7,902,888 | B1 | 3/2011 | Mei et al. |
| 9,900,144 | B2 | 2/2018 | Rogers et al. |
| 10,236,895 | B1 | 3/2019 | Rogers et al. |
| 2002/0105388 | A1 | 8/2002 | Delmot et al. |
| 2003/0197537 | A1 | 10/2003 | Saint-Laurent |
| 2004/0130364 | A1 | 7/2004 | Suzuki |
| 2005/0289405 | A1 | 12/2005 | Rivoir |
| 2007/0205825 | A1 | 9/2007 | Dosho |
| 2009/0015338 | A1 | 1/2009 | Frey |
| 2009/0322432 | A1 | 12/2009 | Liu |
| 2011/0254633 | A1 | 10/2011 | Lin et al. |
| 2013/0099852 | A1 | 4/2013 | Chen |
| 2014/0035632 | A1 | 2/2014 | Lamanna et al. |
| 2014/0292388 | A1 | 10/2014 | Mohajeri et al. |
| 2017/0295009 | A1 | 10/2017 | Rogers et al. |

\* cited by examiner

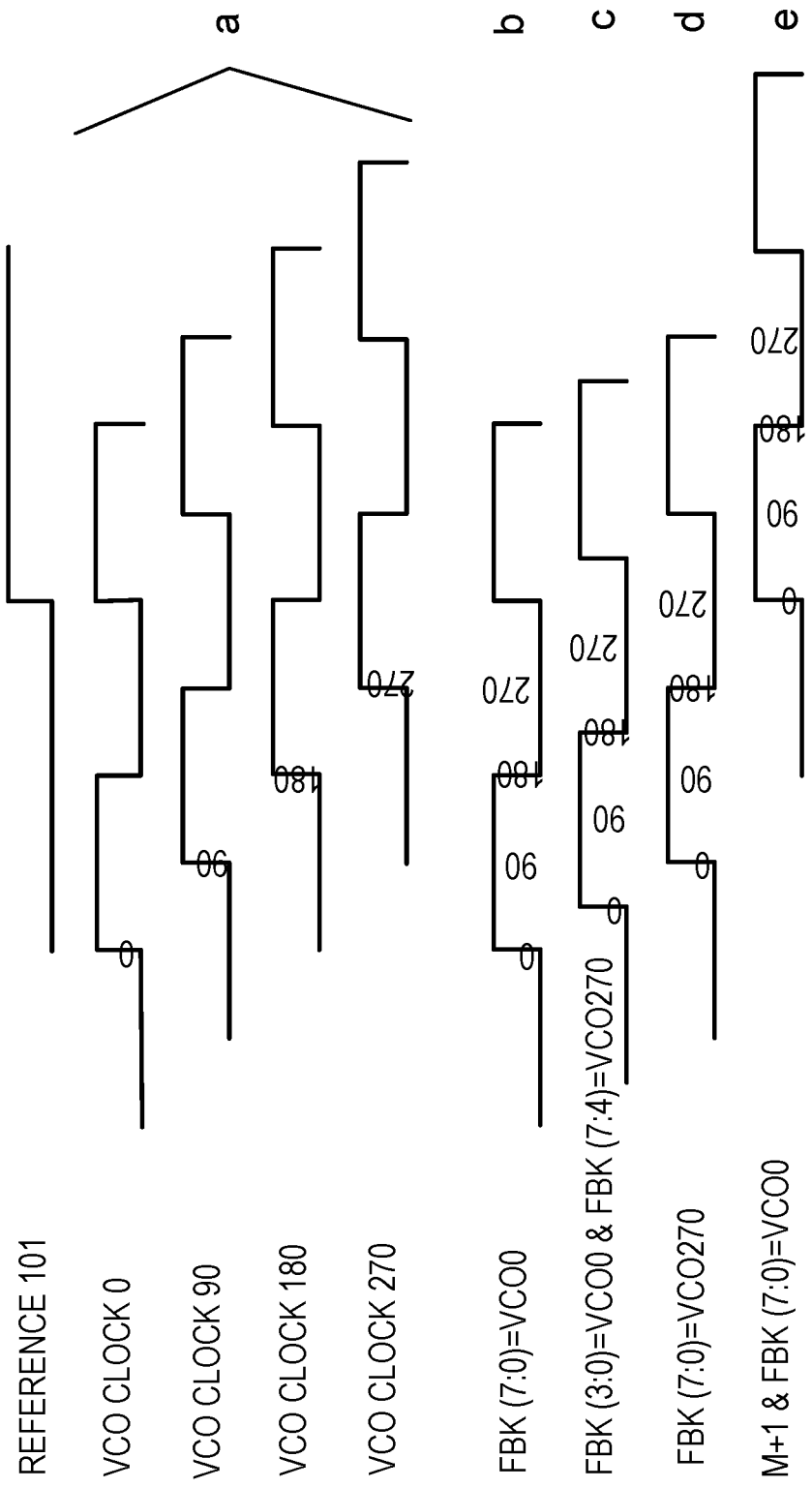

METHOD AND CIRCUITS FOR FINE-CONTROLLED PHASE/FREQUENCY OFFSETS IN PHASE-LOCKED LOOPS

CROSS-REFERENCE TO RELATED APPLICATIONS

This application is a continuation of U.S. application Ser. No. 15/846,353, filed Dec. 19, 2017, now U.S. Pat. No. 10,236,895 issued Mar. 19, 2019, the contents of which are incorporated by reference herein.

TECHNICAL FIELD

The disclosure generally relates to phase locked loop (PLL) devices and in particular to dynamic divider PLL devices.

BACKGROUND

PLL devices generally fall into to two categories, static divider PLLs and dynamic divider PLLs. Integer-N PLLs are generally static divider PLLs. Fractional-N PLLs can be either, but generally fall into the category of dynamic divider PLLs.

SUMMARY

In one aspect, some implementations provide a phase locked loop (PLL) device that includes: a phase and frequency detector (PFD) and charge pump (CP) portion configured to (i) receive a reference clock signal and a feedback clock signal set and (ii) generate an output signal based on a difference between the reference clock signal and a feedback clock signal set; a low pass filter configured to receive the output signal from the PFD and CP portion; a voltage controlled oscillator (VCO) driven by the low pass filter to generate a VCO clock signal; a first divider configured to receive the VCO clock signal and frequency divide the VCO clock signal by a first static factor to generate a first statically divided VCO clock signal; a second divider configured to receive the first statically divided VCO clock signal and further frequency divide the first statically divided VCO clock signal by a second static factor to generate a second statically divided VCO clock signal capable of serving as an output signal of the PLL device; a third divider configured to receive the first statically divided VCO clock signal and capable of frequency dividing the first statically divided VCO clock signal between a first dynamic division ratio and a second dynamic division ratio to generate a third dynamically divided VCO clock signal; a feedback portion including: a first component (i) clocked by either the VCO clock signal or the VCO clock signal with phase variations but without frequency divisions and (ii) configured to receive the third dynamically divided VCO clock signal and generate indicator signals; and a second component configured to receive the indicator signals and to multiplex from the indicator signals to generate the feedback clock signal set for the PFD and CP portion at a clock granularity determined by the VCO clock signal rather than by divisions therefrom; and a master phase/frequency control engine configured to assert a first division control over the third divider and a second multiplex control over the multiplex network.

Implementations may include one or more of the following features.

The first component of the feedback portion may include a shift register. The shift register may be configured to generate the indicator signals including a first indication signal and a second indication signal, wherein the first indication signal is one clock cycle ahead of the second indication signal. The second component of the feedback portion may include a multiplex network that generates a plurality of feedback clock signals to serve as the feedback clock signal set that drives the phase and frequency detector (PFD) and charge pump (CP) portion. The phase and frequency detector (PFD) and charge pump (CP) portion may include multiple instances of phase and frequency detector (PFD) and charge pump (CP), each instance of phase and frequency detector (PFD) and charge pump (CP) respectively receiving a particular feedback signal from the feedback clock signal set.

The first component of the feedback portion may include multiple shift registers. Each shift register from the first component of the feedback portion may be clocked by the VCO clock signal with a respective phase shift but without a frequency division, the respective phase shifts may be evenly spaced within a full clock cycle of the VCO clock signal.

The second component of the feedback portion may include a multiplex network configured to (i) receive the indication signals from the plurality of shift registers; and (ii) generate a plurality of feedback clock signals to serve as the feedback clock signal set that drives the phase and frequency detector (PFD) and charge pump (CP) portion. The phase and frequency detector (PFD) and charge pump (CP) portion may include multiple instances of phase and frequency detector (PFD) and charge pump (CP), each instance of phase and frequency detector (PFD) and charge pump (CP) respectively receiving a particular feedback signal from the feedback clock signal set.

The first component may include a phase interpolator. The phase interpolator may be clocked by the VCO clock signal with a plurality of phase shifts but without a frequency division, the plurality of phase shifts being evenly spaced within a full clock cycle of the VCO clock signal, the phase/frequency control engine asserting interpolation control over the phase interpolator.

The second component of the feedback portion may include a multiplex network configured to (i) receive indication signals from the plurality of shift registers; and (ii) generate a plurality of feedback clock signals to serve as the feedback clock signal set that drives the phase and frequency detector (PFD) and charge pump (CP) portion.

The phase and frequency detector (PFD) and charge pump (CP) portion may include multiple instances of phase and frequency detector (PFD) and charge pump (CP), each instance of phase and frequency detector (PFD) and charge pump (CP) respectively receiving a particular feedback signal from the plurality of feedback clock signals.

The second component of the feedback portion may include a multiplex network configured to (i) receive indication signals from the phase interpolator; and (ii) generate a feedback clock signal to serve as the feedback clock signal set that drives the phase and frequency detector (PFD) and charge pump (CP) portion.

The first component of the feedback portion may include a delay locked loop. The delay locked loop (DLL) may be clocked by the VCO clock signal with a plurality of phase shifts but without a frequency division, the plurality of phase shifts being evenly spaced within a full clock cycle of the VCO clock signal, and the phase/frequency control engine asserting DLL control over the delay locked loop. The second component of the feedback portion may include a multiplex network configured to (i) receive indication signals from the delay locked loop; and (ii) generate a plurality of feedback clock signals to serve as the feedback clock signal set that drives the phase and frequency detector (PFD) and charge pump (CP) portion.

The phase and frequency detector (PFD) and charge pump (CP) portion may include multiple instances of phase and frequency detector (PFD) and charge pump (CP), each instance of phase and frequency detector and charge pump respectively receiving a particular feedback signal from the plurality of feedback clock signals.

The second component of the feedback portion may include a multiplex network configured to (i) receive indication signals from the plurality of shift registers; and (ii) generate a feedback clock signals to serve as the feedback clock signal set that drives the phase and frequency detector (PFD) and charge pump (CP) portion.

The details of one or more embodiments are set forth in the accompanying drawings and the description below. Other aspects, features, and advantages will become apparent from the description, the drawings, and the claims.

DESCRIPTION OF DRAWINGS

FIG. 4A shows examples of timing diagrams during operation of the dynamic divider PLL device of FIG. 4.

Like reference symbols in the various drawings indicate like elements.

DETAILED DESCRIPTION

Dynamic divider PLL devices implementing fractional-N PLLs with finer fractional multiples of reference frequency than otherwise can be achieved by integer-N PLLs. Moreover, the fractional multiples can be generated by dynamically changing the dwell time on a first division ratio and/or the dwell time on a second division ratio that is different from the first division ratio. However, the disadvantage of the dynamic divider PLL device is that when the feedback divider is changed from a first division ratio of M to a second division ratio of N, one or more voltage-controlled oscillator (VCO) clock cycles can be skipped, as seen by the phase and frequency detection (PFD) part of the PLL device. While the PFD part attempts to adjust to this frequency switch that it encounters, the correction mechanism of the PLL device causes the phase at the output of PLL device to have more phase noise or jitter. This injected phase noise may also be known as quantization noise.

Implementations disclosed herein can reduce this phase noise by incorporating a feedback portion to track the phase change in time domain with more granularity in time. In some examples, multiple feedback clock signals are generated to collectively provide feedback for the phase/frequency comparison. In these examples, each feedback signal may drive a respective instance of a phase/frequency comparison and charge pump. The phase adjustment in terms of additional phase delay or advancement may be achieved on a finer temporal scale—within one clock cycle of the VCO clock signal. This is because the various arrangements of multiple instances of feedback signal can correspond to phase changes at various temporal locations within one clock cycle of the VCO clock. In other words, the ability to temporally resolve finer phase changes gives rise to the advantage of maneuvering within one clock cycle of the VCO clock signal. In other examples, a phase interpolator may generate one feedback clock signal by advantageously resolving the phase change (either delay or advance) within one full clock cycle of the VCO clock signal. In these examples, the phase/frequency detection can more closely track the desired phase change at a resolution within one VCO clock cycle, thereby dampening the phase noise injected by changing the division ratio of a dynamic divider.

Figure 1:
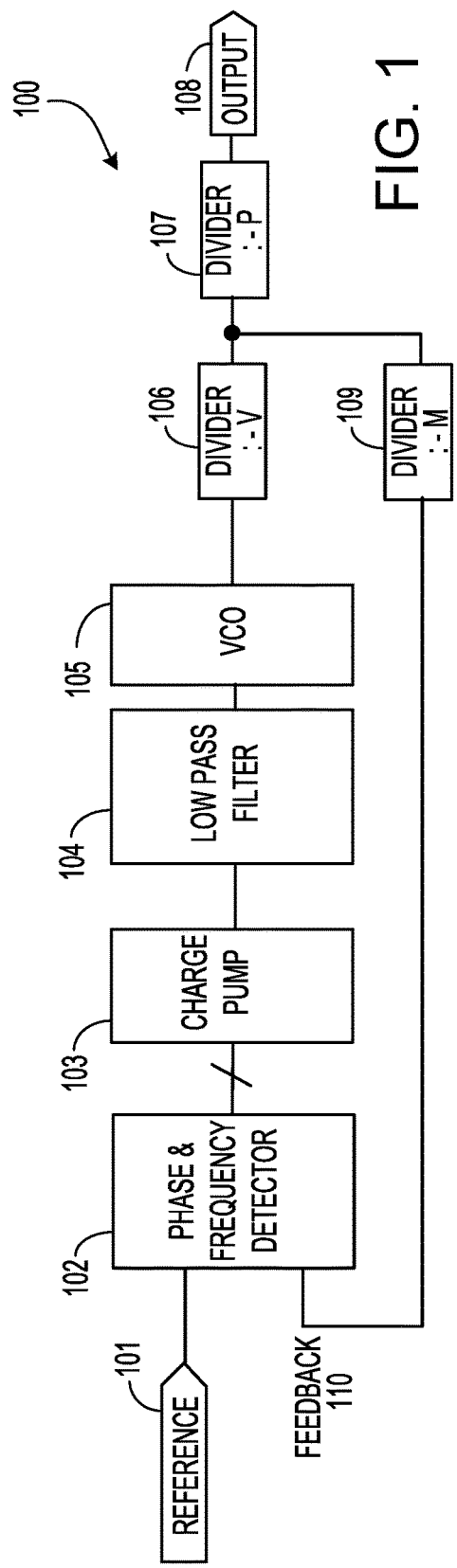
FIG. 1 shows an example of a static divider phase locked loop (PLL) device.

FIG. 1 shows an example of a static divider phase locked loop (PLL) device 100. In this example, a phase and frequency detector (PFD) 102 is configured to receive a reference clock 101 and a feedback signal 110. The PFD 102 is coupled to a charge pump 103 to generate a voltage signal based on the comparison. The voltage signal is then provided to low pass filter 104 which remove high frequency spurious signals by performing integration and low pass filtering. The output of the low-pass filter then drives a voltage controlled oscillator (VCO) 105. The VCO generates an output signal at a frequency, which in some instances, can be proportional to the voltage signal from the low-pass filter 104. The output signal from VCO 105 may be known as the VCO clock signal. In this illustration, the VCO clock signal is frequency divided by a first divider 106 to generated a frequency-divided VCO clock signal that drives a divider 107 and a divider 109. This first frequency division is denoted a division ratio of V. The divider 107 further divides the frequency-divided VCO clock signal to generate the output signal 108. This further frequency division is by division ratio of P. Meanwhile, in a feedback loop, the divider 109 divides the frequency-divided VCO clock signal by a division ratio of M to generate the feedback signal 110, which is then compared with reference 101 by the PFD 102.

In this example, the frequency of the output signal 108 is given by:

$$f_{OUT} = f_{REF} \times \frac{M}{P} \quad (1)$$

The frequency of the VCO clock signal is given by:

$$f_{VCO} = f_{REF} \times \frac{M}{P} \times V \quad (2)$$

The PLL device of this example can produce rational multiples of the reference frequency. In this implementation, if M/P is an integer, the PLL would be termed as an integer-N PLL. If not, the PLL device would be termed a rational-N PLL.

Figure 2:
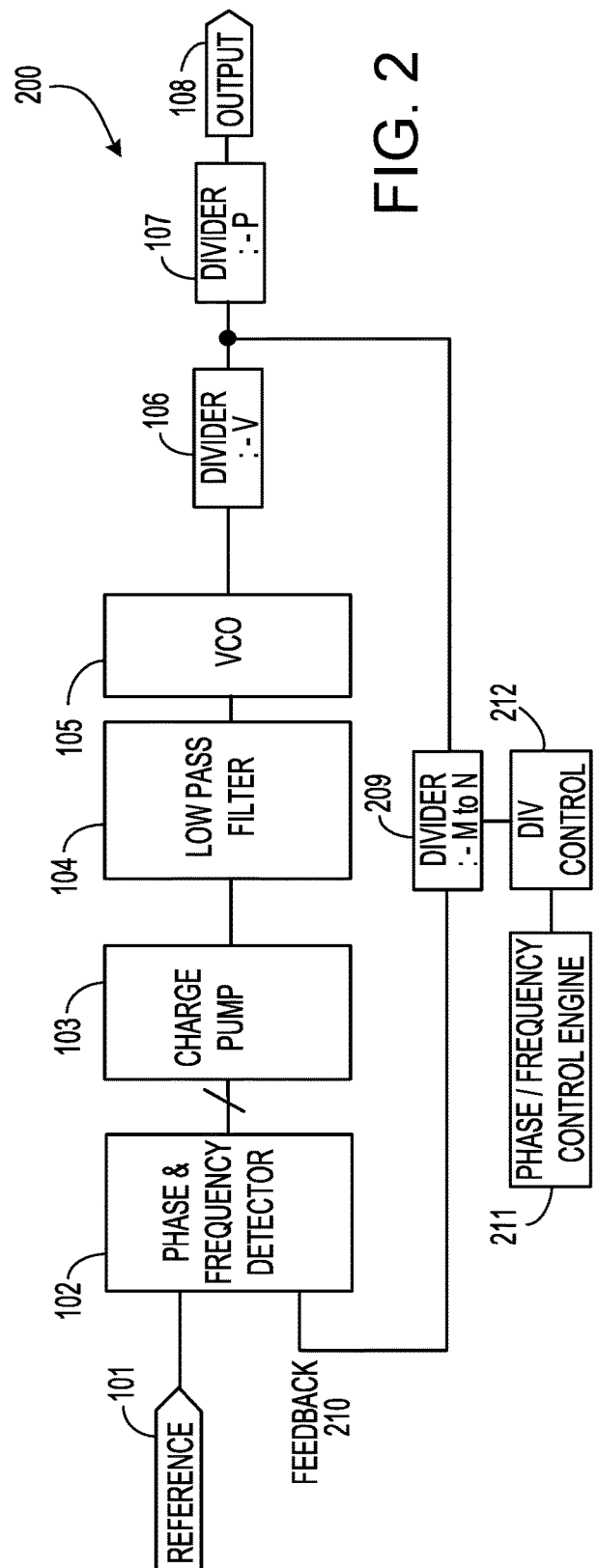
FIG. 2 shows an example of a dynamic divider phase locked loop (PLL) device.

FIG. 2 shows an example of a dynamic divider phase locked loop (PLL) device 200. In this example, a phase and frequency detector (PFD) 102 is configured to receive a reference clock 101 and a feedback signal 210. The PFD 102 is coupled to a charge pump 103 to generate a voltage signal based on the comparison. The voltage signal is then provided to low pass filter 104 which remove high frequency spurious signals by performing integration and low pass filtering. The output of the low-pass filter then drives a voltage controlled oscillator (VCO) 105. The VCO generates an output signal at a frequency, which in some instances, can be proportional to the voltage signal from the low-pass filter 104. The output signal from VCO 105 may be known as the VCO clock signal. In this illustration, the VCO clock signal is frequency divided by a first divider 106 to generate a frequency-divided VCO clock signal that drives a divider 107 and a divider 209. This first frequency division is denoted a division ratio of V. The divider 107 further divides the frequency-divided VCO clock signal to generate the output signal 108. This further frequency division is by division ratio of P. Meanwhile, in a feedback loop, the divider 209 divides the frequency-divided VCO clock signal by a division ratio of M to generate the feedback signal 210, which is then compared with reference 101 by the PFD 102. In this illustration, the divider 209 is a dynamic divider that can perform frequency division between a first division ratio of M to a second division ratio of N. As illustrated, a phase/frequency control engine 211 asserts division control 212 over the divider 209. The division control 212 may generally include logic for switch from a starting division ratio to an ending division ratio.

In this example, if the divider control is set such that divider divides by ratio M for time duration a, and by ratio N for time duration b, the average frequency over the time duration a+b would be:

$$f_{OUT} = f_{REF} \times \frac{M*a + N*b}{(a+b)*P} \quad (3)$$

In this scenario, the VCO frequency would be given by:

$$f_{VCO} = f_{REF} \times \frac{M*a + N*b}{(a+b)*P} \times V \quad (4)$$

If the duration of time b is set to a single cycle of period that corresponds to a frequency divide by N, the PLL output may be deemed to have a phase change as opposed to a frequency change when the frequency has been divided. In this view, multiple executions of phase change could result in a net frequency change.

The advantages and benefits of a dynamic divider PLL is evident in this illustration in that finer fractional and irrational multiples of reference frequency in between M/P and N/P can be generated by dynamically changing the time durations of a and b.

The disadvantage of the dynamic divider PLL is that when the feedback divider is changed from a first division ratio of M to a second division ratio of N, for example, to facilitate a phase change at output 108, one or more VCO cycles may have to be added or skipped, as encountered by the PFD 102. Consider a situation where the PLL is in lock with divide ratio set to M. Then for the next divider cycle, the divide ratio is set to N=M+1 or M−1. This operation will delay the phase of the feedback signal 210 by one VCO time period in the case of divider being set to M+1, or conversely advance the phase of feedback signal by one VCO time period in the case of divider being set to M−1. The delay/advance of phase of feedback 210 cycle will appear at the input of the PFD at the end of N=M+1 or M−1 cycles. The PLL will now act to correct this encountered phase difference by adjusting the frequency of VCO appropriately, till both the reference 101 and feedback 210 are locked in phase and the phase of output 108 has either been delayed or advanced by one VCO cycle. While the PFD 102 tries to adjust to this quantized phase error that it encounters, the correction mechanism of the PLL causes the phase at the output 108 to temporarily have more phase perturbation, also referred to as noise or jitter. This perturbation is also termed quantization noise where the quantum is equal to the phase error encountered at the inputs of the PFD. In this case the minimum quantum that can be seen at the PFD is one VCO cycle, thus the quantization noise is one VCO cycle. The goal is to reduce this quantization noise seen at the feedback inputs of the PFD to improve the noise performance of output clock signal of the PLL device.

Digital mechanisms have been developed to mitigate the quantization noise caused due to divide ratios switching. For example, the dividers may be controlled by Σ–Δ modulation techniques where the dithering between the divide ratios is controlled in such a manner that the quantization noise is transferred to a higher frequency domain. Here, the quantization noise is not reduced or even diminished, but is transferred to a frequency band which is of less importance. Such techniques can be incorporated into embodiments discussed below.

Generally, Σ–Δ modulation is operable for applications where noise can be transferred not too far away a domain in frequency, such as during radio frequency carrier demodulation. However, in some use cases, for example, reference clock generation for serial interface applications, the reference clock may be in the region of 100 MHz. The data serializer/de-serializer (serdes) would have a bandwidth of a few MHz. In this use case, noise would need be transferred to a region of tens of MHz. Transferring the quantization noise on a 100 MHz carrier frequency to a region in excess of 10s of MHz offset might not be that practical. Instead, a method that directly reduces in-band the quantization noise would be more beneficial.

For illustration, the quantization noise would have a minimum quantum equal to one period of the divider excitation frequency. Theoretically, if the divider excitation frequency is increased, that quantum would be reduced. For example, if the frequency of the reference clock signal is set at 100 MHz, the frequency of the output signal is set at about 500 MHz, and the frequency of the VCO is set at about 5 GHz, the quantum would then be 200 ps (⅕ GHz). Every time the dynamic divider, for example, dynamic divider 209, is switched, a quantum jump of 200 ps may be expected at the inputs of PFD 102. A phase error of 200 ps is thus introduced at the input of PFD 102. This phase noise could cause unacceptable or undesirable phase noise (or jitter) at the output of a high-performance PLL device, where, for example, the target performance may have a deterministic peak to peak jitter (DJ) requirement of less than a few ps. Causing phase change at the PLL output in quantums of one VCO cycle (or time period) could cause this DJ to be in excess of requirements. Implementations disclosed herein can effective mitigate such phase errors.

Figure 3:
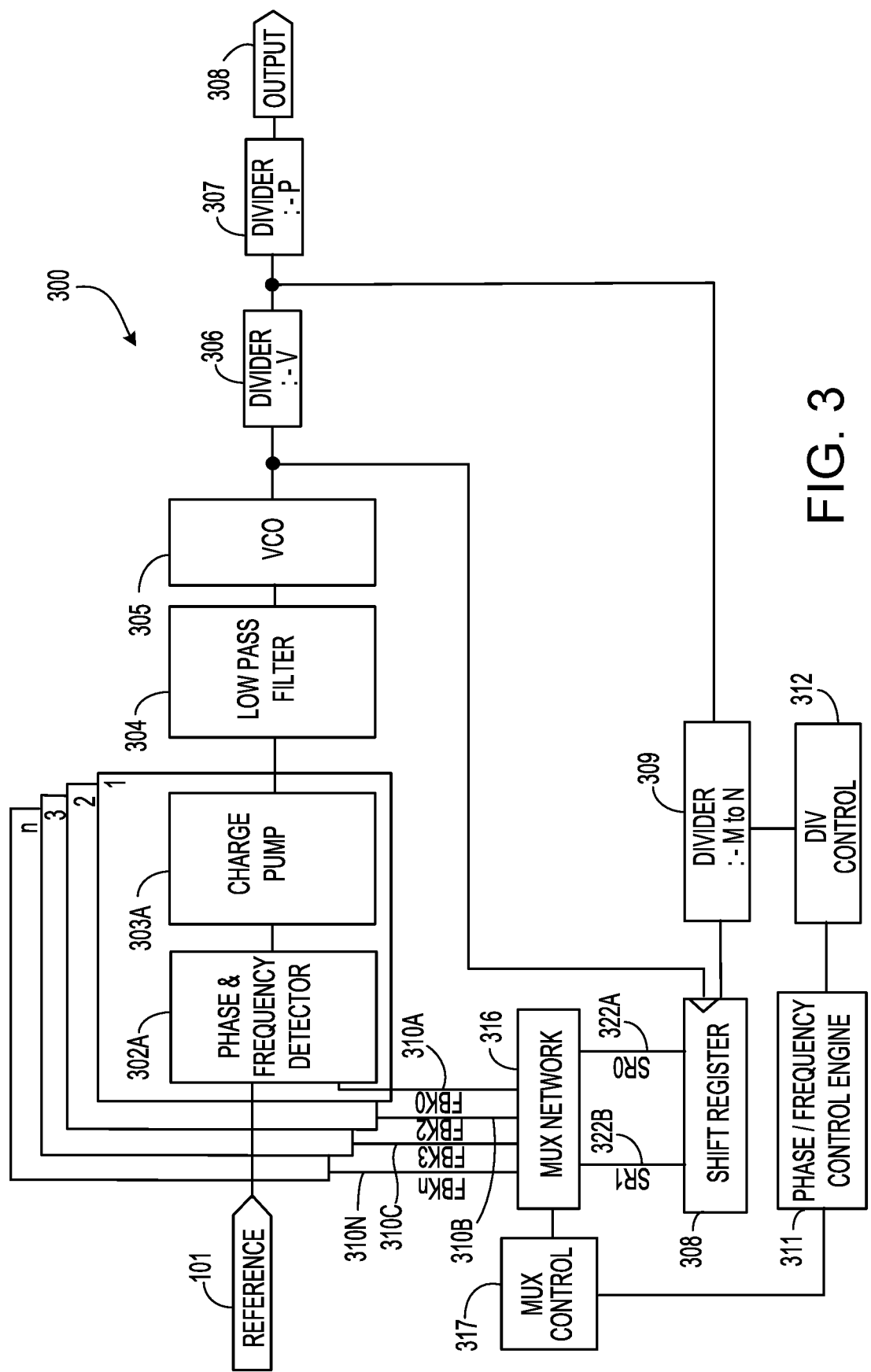
FIG. 3 shows an example of a dynamic divider PLL device with multiple instances of phase frequency detector (PFD) and charge pump (CP).

FIG. 3 shows an example of a dynamic divider PLL device with multiple instances of phase frequency detector (PFD) and charge pump (CP). In this example, the PFD/CP of FIG. 1 is split into n different PFD/CP instances, namely PFD 302A to 302N and CP 303A to 303N. Each CP from these n instances, namely 303A to 303N, could have a separate feedback input. Each of the n instances could have 1/n of the current from the PFD/CP of FIG. 1. A low-pass filter 304 performs integration and filtering of currents from all CP instances to generate a voltage signal. A VCO 305 is coupled to the output of this voltage signal from low pass filter 304. The VCO 305 generates a frequency signal that can be proportional to the voltage signal. This VCO output signal is then divided by a divider 306 by a factor of V. The output of the divider 306 is provided to the divider 307 that further divides the frequency by a factor of P to generate output 307A.

The output of divider 306 is also provided to divider (M to N) 309. This divided output is then input to a shift register 308. The output of the VCO 305 is also provided as input to the shift register 308, to serve as its clocking frequency. The outputs of shift register SR0 and SR1 toggle at the lower divided frequency of VCO, namely $f_{VCO}/(V*M)$ or $f_{VCO}/(V*N)$. SR0 and SR1 are delayed by 1 VCO clock cycle, with SR0 being the earlier in phase and SR1 later. As illustrated in FIG. 3, master phase/frequency control engine 311 asserts divisional control over divider (M to N) 309 through the divider control logic 312. This control logic 312 can be reconfigurable logic. This divisional control 312 pertains to the programmed transition from a first configuration of frequency division of dividing by a factor of M to a second configuration of frequency division of dividing by a factor of N. This programmed transition includes a precise timing element for the transition. In other words, this frequency division switch will transpire at a precise temporal moment, as controlled by phase/frequency control engine 311. In this illustration, phase/frequency control engine 311 further asserts mux control 317 so that mux network 316, with inputs SR0 (322A) and SR1 (322B), and outputs FBK0 to FBKn. The mux network will connect each of the FBK signals to either SR0 or SR1. Either all PFD/CPs could be connected to one, or the other, or a portion of them could be one and remainder to the other. The introduction of multiple instances of PFD/CP devices to drive the VCO 305 allows distinct feedback clock signals for each instance being driven by either the earlier in phase SR0 or later in phase SR1. In effect, this configuration will allow the quantization noise to be reduced from one VCO time period to a fraction equivalent to 1/n of the period of VCO. This in essence is the jist of the invention.

Figure 3A:
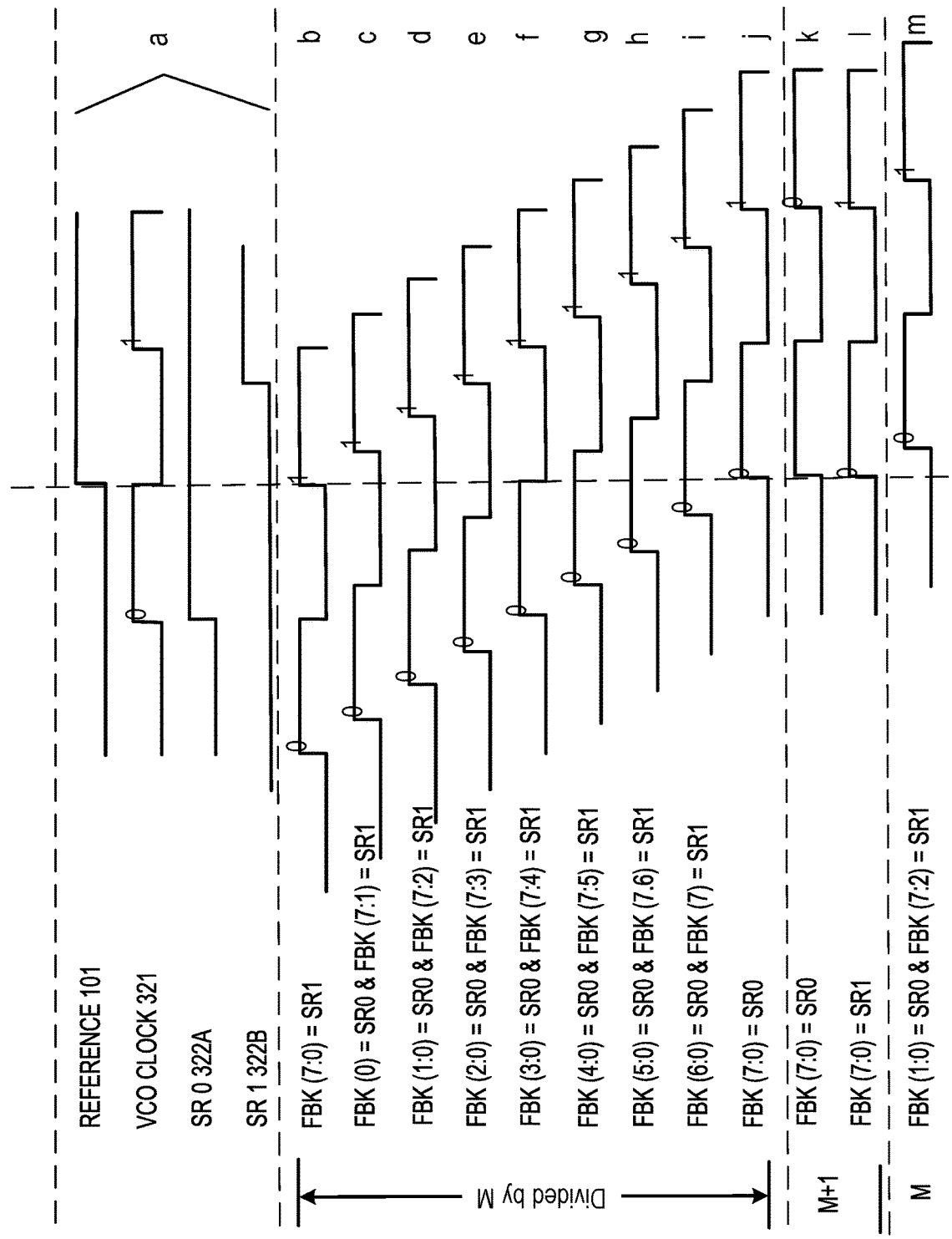
FIG. 3A shows examples of timing diagrams during operation of the dynamic divider PLL device of FIG. 3.

To further illustrate the output feedback with respect to various timing conditions and input conditions, FIG. 3A shows examples when the dynamic divider PLL device of FIG. 3 is operating under various inputs of SR0 and SR1. For clarity of illustration and without loss of generality, divider, propagation path delays, PFD/CP mismatch, charge pump nonlinearity etc. are neglected to simplify the drawings. The illustrated example assumes 8 (eight) PFD/CPs, which are numbered sequentially from 0 to 7. In this illustration of FIG. 3A, these eight instances use the same REFERENCE clock signal (101). These eight instances jointly drive VCO 305 to generate VCO clock signal 321. The eight instances respectively take feedback inputs labeled FBK0 to FBK7. FIG. 3A(a) shows the position of the VCO clock when half (i.e. 4) of the PFD/CPs are connected to SR0 and remaining half are connected to SR1. Because half of the PFD/CPs are adjusting to the VCO to produce a signal where the divided feedback clock is aligned in phase with the reference signal, i.e. SR0 be aligned to REFERENCE, and the other half are aligning SR1 to REFERENCE, the VCO clock will be aligned in such a way that the REFERENCE clock is in between the two edges of the VCO clock. As illustrated, the position of SR0 (322A) will lead REFERENCE by half a cycle and SR1 (322B) will lag REFERENCE by half a cycle. The edge occurrences of SR0 and SR1 are respectively denoted as 0 and 1 on the VCO clock waveform in subgraph (a) and succeeding subgraphs.

The method of phase delaying the VCO with respect to the REFERENCE signal is described below. As a starting point, when all eight (8) PFD/CPS are connected to SR1 (322B), the VCO signal 321 will present itself as shown in subgraph (b). In this particular instance, SR0 is ahead of the REFERENCE signal by one VCO cycle; and SR1 aligns with REFERENCE clock 101. As all PLL clocks originate from the VCO, the output 108 will also align to SR0, i.e. will be at one VCO period phase leading the REFERENCE signal if divider, buffer, clock distribution etc. delays were ignored.

From subgraph (b) onward, the VCO clock signal 321 and its derivatives including output 108 can be phase delayed with respect to the REFERENCE clock 101 as the feedback input for the PFD/CPs are sequentially moved from SR1 (as shown in b) to SR0 (as shown in j) by connecting more instances of PFD/CP from SR1 to SR0 so that more instances of PFD/CP are connected to SR0 than to SR0. As shown in subgraphs (c) through (j), for each step of moving the PFD/CP input from SR1 to SR0, the phase of the VCO is delayed by ⅛ of a VCO cycle. When all PFD/CP inputs are connected to SR0 (322A), the phase of the VCO clock signal 321 is shown in subgraph (j). At this position, SR0 (322A) aligns with REFERENCE clock 101 while SR1 (322B) is phase delayed by one VCO clock cycle. In this phase delay feedback process, the granularity of phase adjustment relates to the smallest number of PFD/CP instances that could be set from one of SR0 and SR1 to the other of SR0 and SR1. The speed of phase adjustment may hinge on, in one particular VCO clock cycle, the number of PFD/CP instances that could be set from one of SR0 and SR1 to the other of SR0 and SR1.

At this time, if further phase delay is still desired, two actions could be taken simultaneously. First, the divider ratio can be increased from M to M+1 for one REFERENCE clock cycle. Since an extra VCO clock cycle is needed for SR0 and SR1 to be generated by this divide ratio increase, SR0 and SR1 will lag REFERENCE clock 101 by one VCO clock cycle as shown in subgraph (k). Second, at the same time when change is made to the divide ratio, if all PFD/CPs are switched to SR1 from SR0, then the VCO clock signal will see one full clock cycle advance as shown in subgraph (l). For illustration, the positions of SR0 and SR1 with regard to. the REFERENCE signal, are displayed in subgraphs (j) and (l). The position in the phase of SR0 and SR1 are the same; but all PFDs are connected from SR0 in subgraph (j) to SR1 in subgraph (l). Now, further fractional period phase delay can be implemented as shown in (m) where one PFD/CP is connected to SR0, thereby delaying the phase of the VCO by ⅛ of a VCO cycle. Notably, from the starting position shown in (b) to the position shown in (m), the PLL clocks have shifted in phase by ⅛ of a VCO cycle with respect to the REFERENCE signal, as demonstrated by the vertical dashed line on the timing diagrams of FIG. 3A.

Phase advance of the VCO can also be achieved by doing the reverse of what has been described above. In other words, if all PFD/CPs are connected to SR0 and then incrementally more instances of PFD/CPs are connected to SR1, phase advance is achieved with each increment of a PFD/CP instance connected from SR0 to SR1. If a phase advance that is large than one VCO cycle is desired, steps shown in 3A (k) and (l) can be implemented, except that the divider is set to divide by factor M−1 for one divider cycle.

Through predetermined sequences of phase lag and phase advance the frequency at the output of the PLL can manipulated with fine granularity and with diminished quantization noise. As one example, in spread spectrum clocking applications phase could be continuously delayed for a period of time to ramp frequency at output down to say −0.5% of nominal, and then frequency ramped back up to nominal. Ramping frequency down and back up continuously will spread the spectral energy of the output over a wider band and implement spread spectrum clocking. As another example, the phase of the PLL output could be continuously ramped up or down to provide an incremental change in frequency from nominal. This functionality will be useful in calibrating the frequency of a MEMS oscillator, which are known to have wide manufacturing tolerances. As a third example, the phase of the output could be varied to track another external signal, as could be used in serial data capture applications. Indeed there are many useful applications for this invention.

Figure 4:
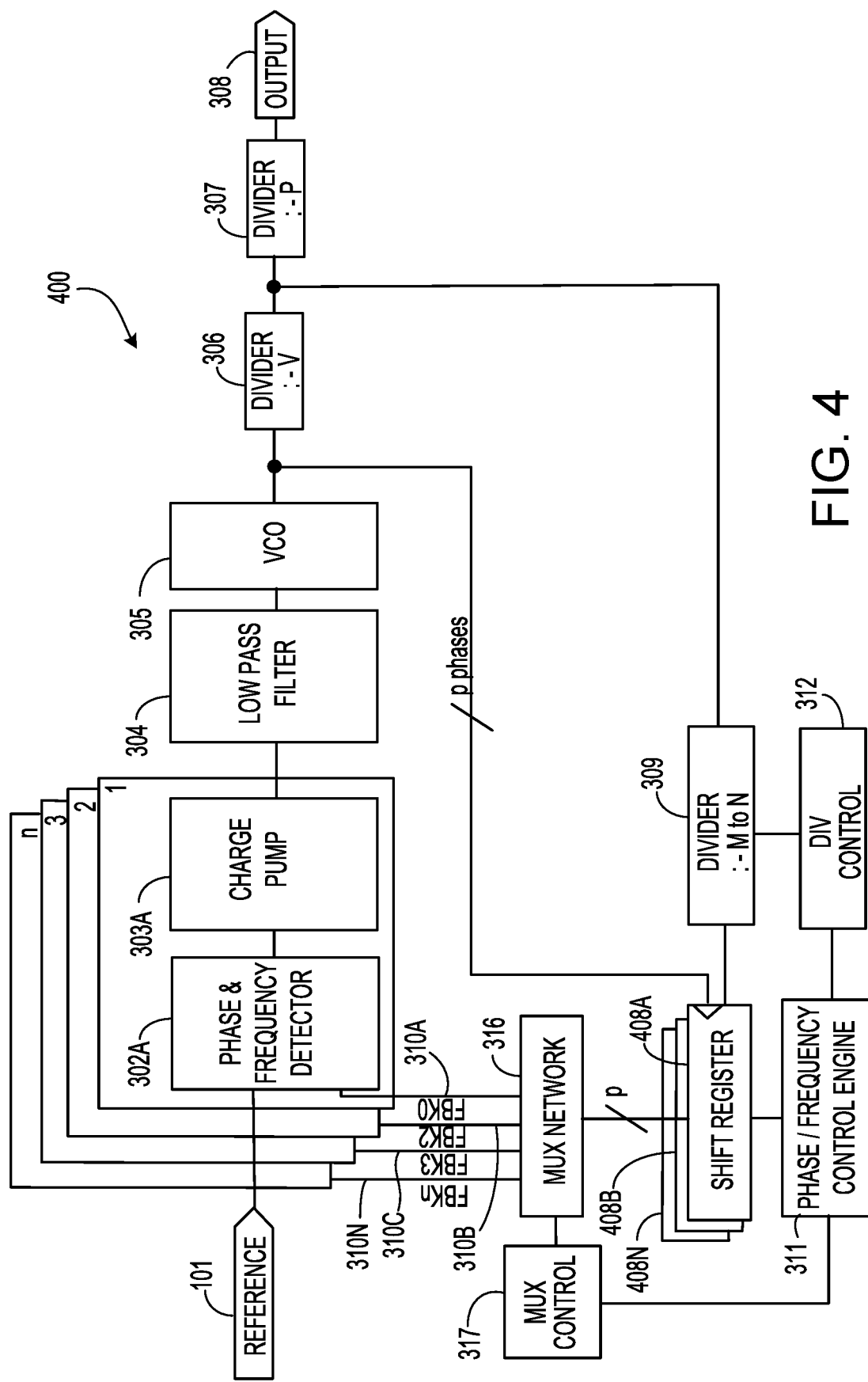
FIG. 4 shows another example of a dynamic divider PLL device with multiple instances of PFD/CP.

In another modification, instead of taking just one output of the VCO, multiple p phases may be taken out of the VCO. Rather than connecting the PFD/CPs to feedback signals which are one cycle of the VCO apart, i.e. the outputs of the shift register, as shown in FIG. 3, the PFD/CPs may be individually connected to feedback signals which are VCO cycle/p apart, as shown in FIG. 4 with p is the number of phases. In this example, the quantum of phase step is reduced, thus allowing for a commensurate decrease of the quantization noise. Here, compared to having multiple M-N dividers each clocked by the various p phases of the VCO clock signal, a single divided clock is more advantageously used which is then phase shifted by multiple shift registers clocked by the fine-grained VCO phases. This advantage of operating on a single divided clock is evidenced by the singular phase/frequency control engine 311 that synchronizes the shift registers 408A to 408N. This phase/frequency control engine 311 further controls the divider control 312 for the singular divider (M to N) 309 as well as the mux control 317 for the mux control network 316.

The timing control for this example of a PLL 400 in FIG. 4 operates in an analogous manner to the example of FIG. 3. FIG. 4A illustrates the operation of the example of FIG. 4 for delaying the PLL output with improved time precision. In this illustration, four phases of the VCO clocks are taken from VCO 305 to drive the four instances of shift registers 408A to 408D. Each of these four phases are separated by 90° as shown in subgraph (a). As discussed in the example of FIG. 3, there are eight PFD/CP instances. If all the eight instances are connected to a feedback signal on phase VCO0, the VCO clock signal will align itself with respect to REFERENCE clock 101 as shown in subgraph (b). If four PFD/CPs are connected to VCO0 and the remaining four are connected to VCO phase of VCO270, the VCO clock signal will be phase delayed with respect to REFERENCE clock signal 101 by 45° as shown in subgraph (c). Here, a finer granularity of 11.25° of phase control can be achieved by connecting different numbers of PFD/CPs to the different VCO phases. This is because there are eight likely connection arrangements over a 90° span of phase adjustment. Each position corresponds to a configuration of distributing the feedback signals to the four chosen phases. For example, between having all eight instances connected to VCO0 and all eight instances connected to VCO90, there are eight likely connection arrangements, each with one more instance of PFD/CP being connected from VCO0 to VCO90. As explained earlier in FIG. 3A, the VCO clock signal could be adjusted in phase with respect to the REFERENCE clock 101 until a full 360° phase shift has been accomplished, as shown in subgraph (d). At this point, an extra VCO cycle can be introduced by changing the divide ratio of divider 309 from M to M+1 while simultaneously shifting the PFD/CPs to the appropriate tap of VCO0, as shown in subgraph (e).

Figure 5:
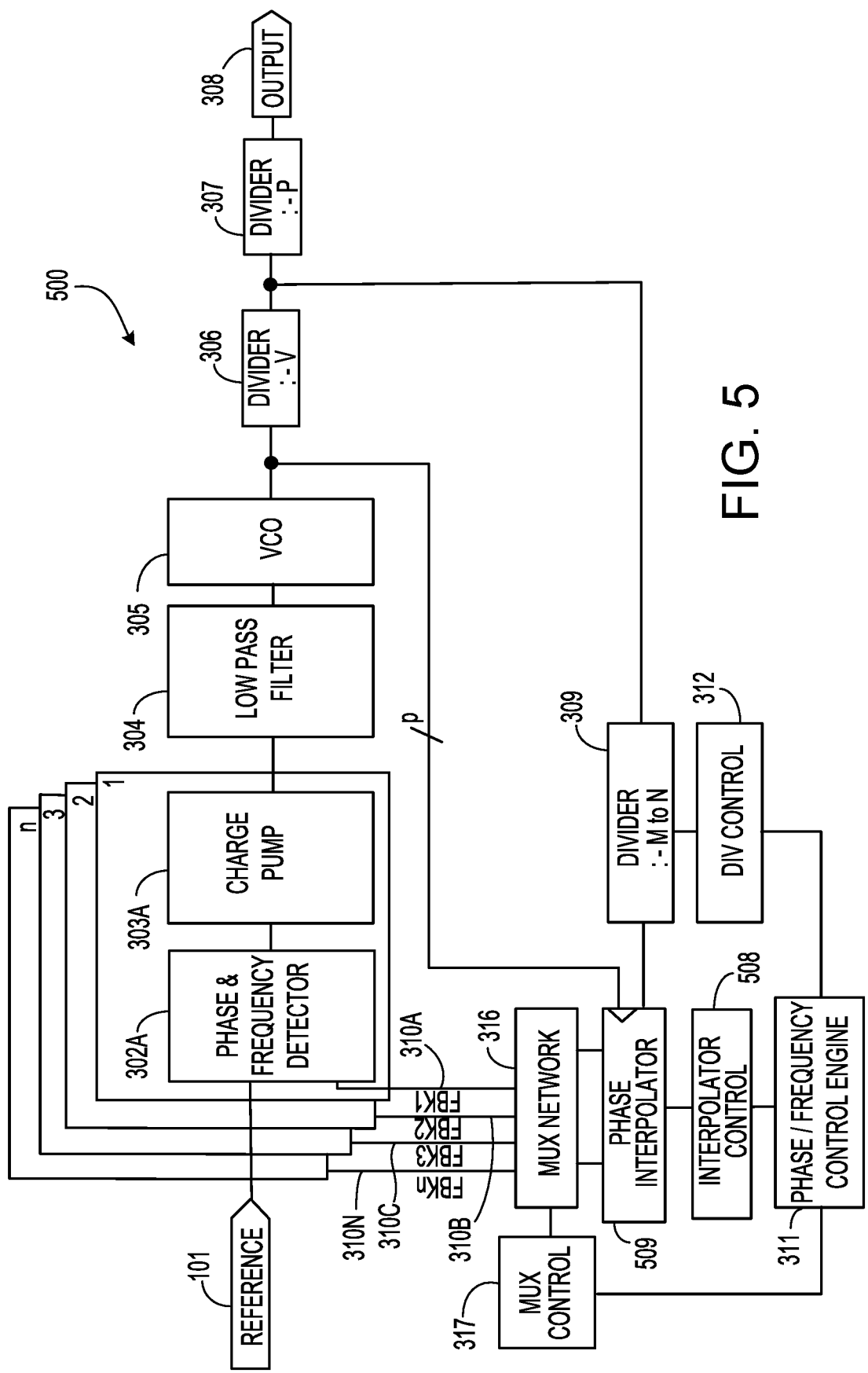
FIG. 5 shows yet another example of a dynamic divider PLL device with multiple instances of PFD/CP.

FIG. 5 shows yet another example of a dynamic divider PLL 500 with multiple instances of PFD/CP. In this example, a number of PFD/CP instances are arranged as shown in 302A/303A to 302N/303N. Each of the PFD/CP instances receives a REFERENCE signal 101 and a feedback clock signal (shown as FBK1 to FBKn). The output currents from these PFD/CP instances are routed to low pass filter 304. In some implementations, low pass filter 304 performs removal of spurious signals by virtue of integration and/or filtering. The output voltage from low pass filter 304 is received at voltage controlled oscillator (VCO) 305. The VCO 305 generates a frequency signal that can be proportional to the voltage signal. This VCO output signal is then divided by a divider 306 by a factor of V. The output of the divider 306 is provided to the divider 307 that further divides the frequency by a factor of P to generate output 307A.

As shown in FIG. 5, the output of divider 306 is also provided to divider (M to N) 309. This divided output is then provided to the input of phase interpolator 509. Moreover, p phases are taken from the output of VCO305 as clock inputs to phase interpolator 509. In some instances, two phases are taken to indicate leading or lagging, like the examples of SR0 and SR1. In other examples, four phases are taken, like the examples of VCO0, VCO90, VCO180, and VCO270. Here, master phase/frequency control engine 311 applies divisional control over divider (M to N) 309 through the divider control logic 312, which may include reconfigurable hardware logic. Like the example in FIG. 3, this divisional control 312 pertains to the programmed transition from a first configuration of frequency division of dividing by a factor of M to a second configuration of frequency division of dividing by a factor of N. In the example of FIG. 5, master phase/frequency control engine 311 asserts interpolator control over interpolator 509 through the interpolator control logic 508, which can also include reconfigurable hardware logic. Master phase/frequency control engine 311 further applies control over MUX network 316 through MUX control 317, which may also include reconfigurable hardware.

Figure 7:
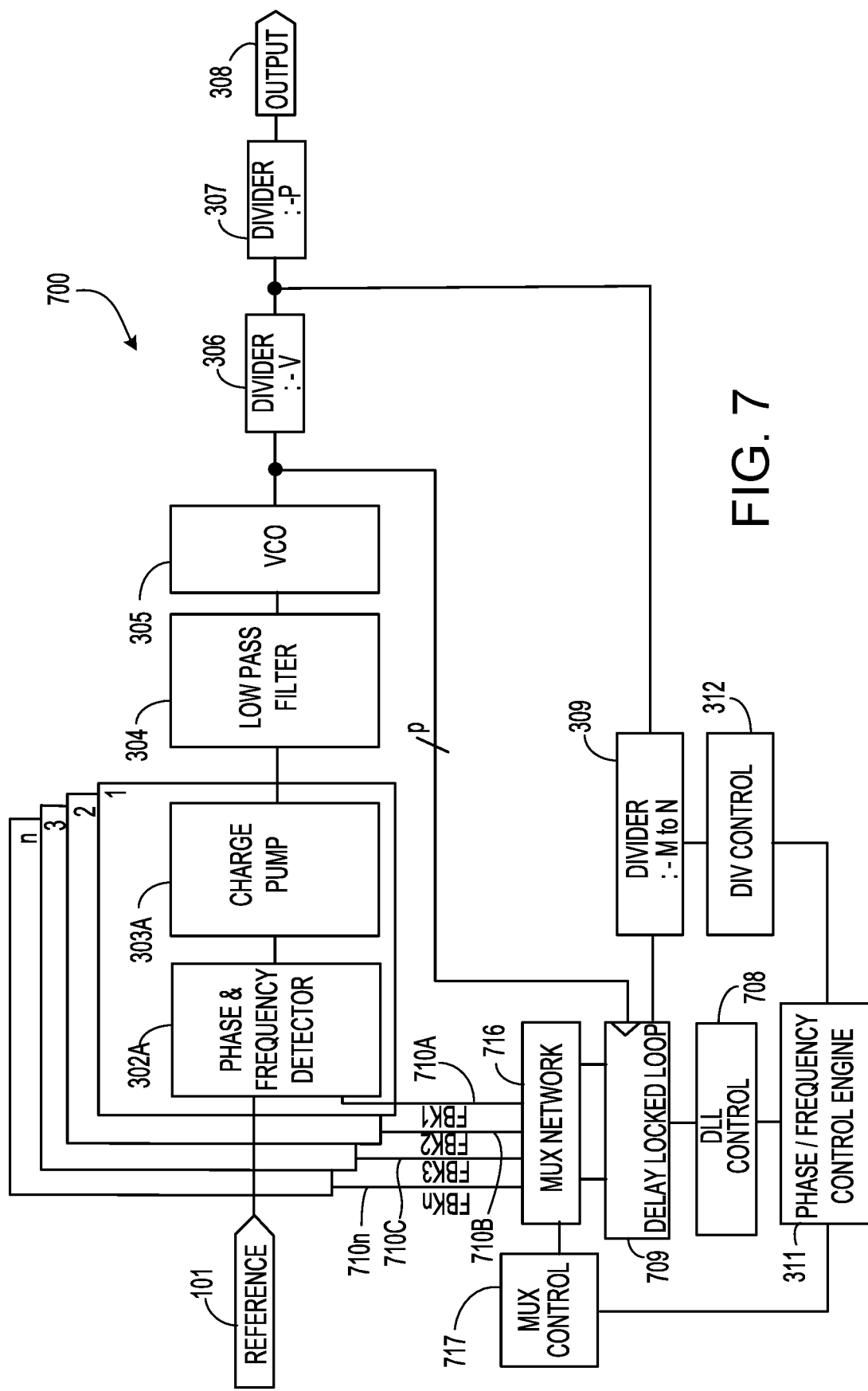
FIG. 7 shows yet still another example of a dynamic divider PLL device with multiple instances of PFD/CP.

In some implementations, phase interpolator 509 includes digital logic that operates under divider M to N 309 as well as phase signals (e.g., SR0 and SR1, or VCO0, VCO90, VCO180, and VCO270) pulled from the output of VCO305. The phase interpolator can be implemented by a variety of conventional circuit implementations. In one example of a circuit implementation, the phase interpolator is configured to accept two phases of a reference clock and then produce an output which has a phase that is a weighted sum of the two input phases. In this way, the output can be at a fractional difference between the two reference phases. For example, if p phases are brought out of the VCO and fed into the phase interpolator block 509, any one of these p phases can be used to fractionally adjust phase of the divider 309 output by a value equal to 360°/p. In this example, if a m bit phase interpolator is used to generate further fractional phases inbetween any two phases of the p reference clocks, the phase of divider output 309 can be adjusted by a value equal to 360°/(p*m). The output of the digital logic may drive the MUX network 316 that is running under mux control logic 317 from master phase/frequency control engine 311, such that each of the FBK1 to FBKn are at phase separation of 360°/(p*m). The output of MUX network 316 includes feedback clock signals FBK1 to FBKn that each connects to a respective PFD/CP instance. Phase interpolator 609 may be replaced with comparable circuits. For example, referring to FIG. 7, delay locked loop 709 can be used in lieu of a phase interpolator. The delay locked loop (DLL) can be implemented by a variety of conventional circuit implementations. An example of the circuit implementation for the DLL includes variable delay line and control mechanisms such that the delay between input and output of the delay line can be adjusted precisely to be equal to the delay of one or two references. In this example, the delay of the line could be set to be equal to two successive phases of VCO phases p. If the delay line is comprised of m delay elements, and total delay is set to be equal to delay of successive phases of VCO outputs, then the phase delay of each element will be 360°/(p*m). The outputs of each of these delay line delay elements can be muxed (multiplexed) out to produce a full range of phase delays over the VCO clock period. The delay locked loop 709 may operate under DLL control 708 from master phase/frequency control engine 311. In accordance with the descriptions for FIGS. 3A and 4A, the operation of phase adjustment in this example PLL 500 is performed at a granularity of a fraction of one VCO clock period cycle. This improvement in reduction of phase adjustment quantum corresponds to the number of PFD/CP instances installed. Such increase only involves a small overhead of silicon area and wiring. Once amortized over a large scale production, this overhead becomes negligible. The improvement in phase noise reduction, however, correlates with the number of PFD/CP instances.

Figure 6:
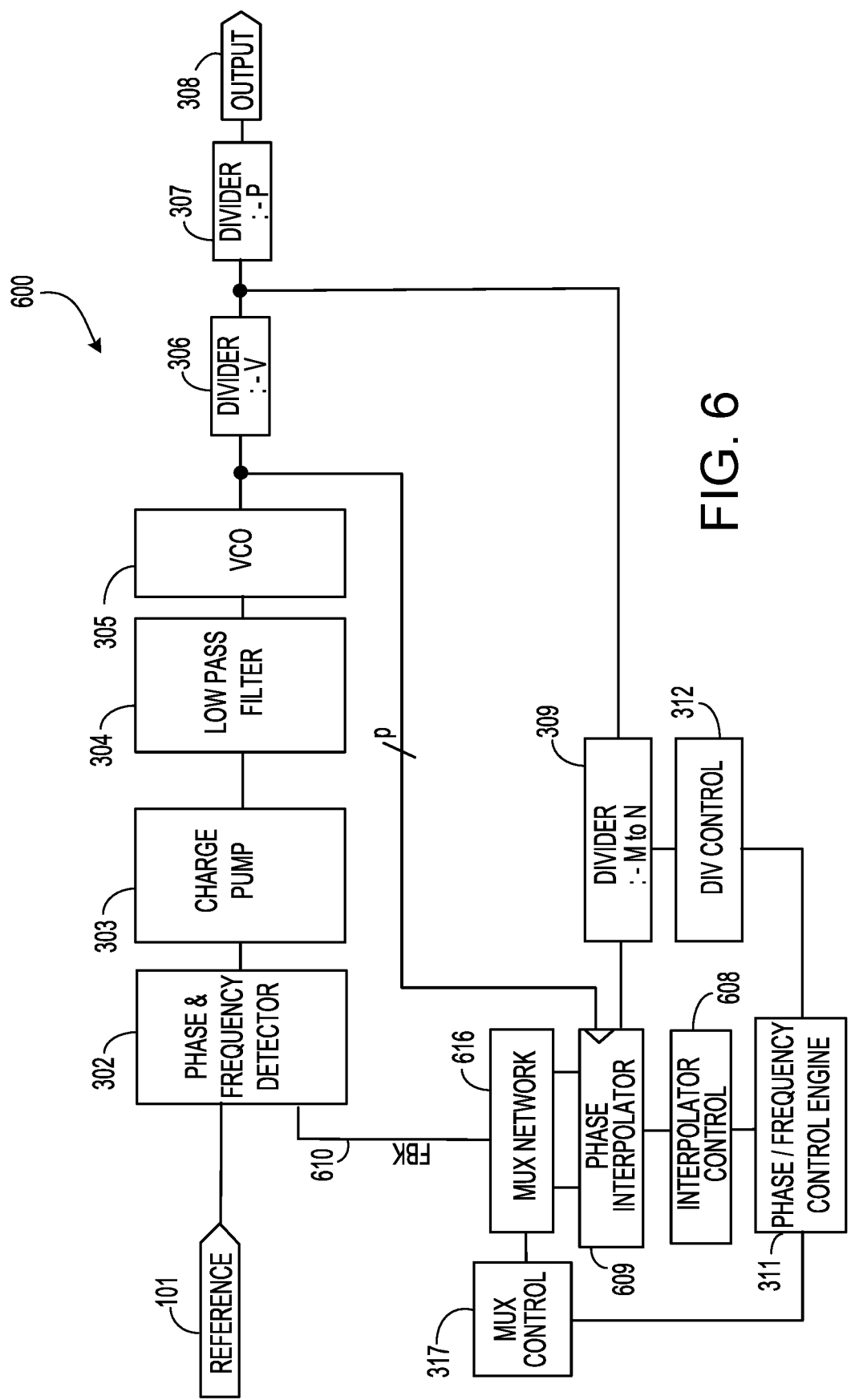
FIG. 6 shows still another example of dynamic divider PLL devices.
Figure 8:
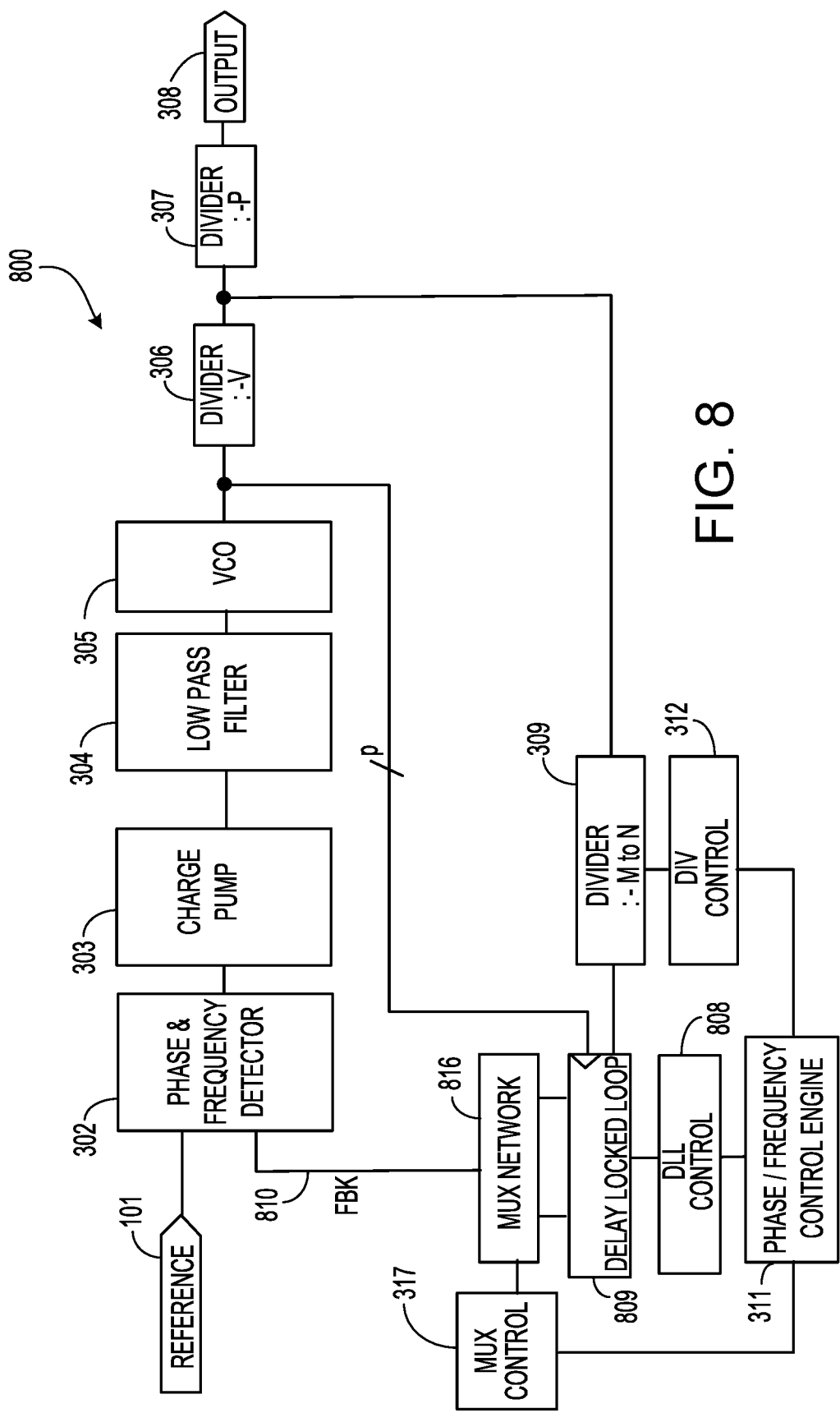
FIG. 8 shows still yet another example of a dynamic divider PLL device.

FIG. 6 shows still another example of dynamic divider PLL. Here, instead of multiple PFD/CP instances, only one PFD/CP instance is installed. As illustrated, phase interpolator 609 operates under interpolator control logic 608 from master phase/frequency 608. The phase interpolator 609 received p phases pulled from the output of VCO 305. The phase interpolator 609 also receives the output frequency signal from divider M to N 309. The phase interpolator 609, under refined interpolator control logic 608, may generate smaller scale phase adjustment than those achievable from FIGS. 1 and 2. The improvement in reducing phase adjustment quantum is premised on the precision of interpolation. In some instances, the interpolation can achieve a phase resolution of a fraction of one VCO clock cycle. In these instances, the digital logic of phase interpolator 609 generally performs fixed point interpolation, although floating point phase resolution is feasible. The phase interpolator 609 can be replaced with other circuits. Referring to FIG. 8, delay locked loop 809 may be used in lieu of phase interpolator 609. Here, the delay locked loop 809 operates under DLL control logic 808.

What has been described is a dynamic divider PLL method and apparatus which can be employed on or in conjunction with Σ-Δ modulation for, for example, deserializing incoming bit stream on a USB device. Although the example of PLL circuit is advantageously employed as an on-chip component of any chip requiring a PLL, the advantages of the application are best exploited within microprocessor chips having very high operational frequencies. Indeed, a number of implementations have been described. Nevertheless, it will be understood that various modifications can be made without departing from the spirit and scope of the subject innovation. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A method for operating a phase locked loop (PLL) device, the method comprising:
   receiving, at a phase and frequency detector (PFD) and charge pump (CP) portion, a reference clock signal and a feedback clock signal set;
   generating, at the PFD and the CP portion, an intermediary signal based on a difference between the reference clock signal and a feedback clock signal set;
   using the intermediary signal from the PFD and the CP portion to drive a voltage controlled oscillator (VCO) such that a VCO clock signal is generated;
   frequency dividing the VCO clock signal by a first static factor to generate a first statically divided VCO clock signal;
   splitting the first statically divided VCO clock signal by:
      frequency dividing the first statically divided VCO clock signal further by a second static factor to generate a second statically divided VCO clock signal as an output signal of the PLL device, while
      (ii) frequency dividing the first statically divided VCO clock signal further by a dynamic division ratio to generate a third dynamically divided VCO clock signal; and
   based on the third dynamically divided VCO clock signal, generating the feedback clock signal set for the PFD and CP portion at a first clock granularity determined by the VCO clock signal and not less than a second clock granularity of the VCO clock signal.

2. The method of claim 1, wherein the first clock granularity does not result from dividing the VCO clock signal while the second clock granularity results from dividing the VCO clock signal.

3. The method of claim 1, further comprising:
   adjusting the dynamic division ratio between a first dynamic division ratio and a second dynamic division ration.

4. The method of claim 1, wherein generating the feedback clock signal set comprises:
   receiving multiple indicator signals based on the third dynamically divided VCO signal; and
   multiplexing the multiple indicator signals to generate a plurality of feedback clock signals to serve as the feedback clock signal set that drives the phase and frequency detector (PFD) and charge pump (CP) portion.

5. The method of claim 4, further comprising:
   using a shift register to generate the feedback clock signal set.

6. The method of claim 5, wherein generating the multiple indicator signals comprises generating a first indicator signal and generating a second indicator signal, and wherein the first indicator signal is one clock cycle ahead of the second indicator signal.

7. The method of claim 5, wherein generating the feedback clock signal set comprises generating a plurality of feedback clock signals to drive the phase and frequency detector (PFD) and charge pump (CP) portion.

8. The method of claim 7, wherein the phase and frequency detector (PFD) and charge pump (CP) portion comprises multiple instances of phase and frequency detector (PFD) and charge pump (CP), and wherein generating a plurality of feedback clock signals to drive the phase and frequency detector (PFD) and charge pump (CP) portion comprises generating a plurality of feedback clock signals to drive each instance of phase and frequency detector (PFD) and charge pump (CP) with a particular feedback signal from the feedback clock signal set.

9. The method of claim 4, further comprising:
using a plurality of shift registers to generate the feedback clock signal set.

10. The method of claim 9, further comprising:
clocking the plurality of shift registers by the VCO clock signal with a respective phase shift but without a frequency division, and wherein the respective phase shifts are evenly spaced within a full clock cycle of the VCO clock signal.

11. The method of claim 9, further comprising: receiving the multiple indicator signals from the plurality of shift registers.

12. The method of claim 9, wherein the phase and frequency detector (PFD) and charge pump (CP) portion comprises multiple instances of phase and frequency detector (PFD) and charge pump (CP), and wherein receiving a feedback clock set comprises respectively receiving a particular feedback signal from the feedback clock signal set at each instance of phase and frequency detector (PFD) and charge pump (CP).

* * * * *

UNITED STATES PATENT AND TRADEMARK OFFICE
CERTIFICATE OF CORRECTION

PATENT NO. : 10,797,709 B2
APPLICATION NO. : 16/353161
DATED : October 6, 2020
INVENTOR(S) : Alan C. Rogers and Raghunand Bhagwan Page 1 of 1

It is certified that error appears in the above-identified patent and that said Letters Patent is hereby corrected as shown below:

In the Claims

Column 12, Line 24, Claim 1, before "frequency" please add -- (i) --; and

Column 12, Line 44, Claim 3, please delete "ration" and insert therefor -- ratio --.

Signed and Sealed this
Fifth Day of January, 2021

Andrei Iancu
*Director of the United States Patent and Trademark Office*